US006921723B1

United States Patent
Lee et al.

(10) Patent No.: US 6,921,723 B1
(45) Date of Patent: Jul. 26, 2005

(54) ETCHING METHOD HAVING HIGH SILICON-TO-PHOTORESIST SELECTIVITY

(75) Inventors: Yung-Hee Yvette Lee, San Jose, CA (US); Shashank Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 79 days.

(21) Appl. No.: 10/128,907

(22) Filed: Apr. 23, 2002

(51) Int. Cl.[7] .......................................... H01L 21/302
(52) U.S. Cl. ................ 438/710; 438/714; 438/717; 438/718; 438/719; 438/724; 438/725
(58) Field of Search ................ 438/710, 714, 438/717, 718, 719, 724, 725

(56) References Cited

U.S. PATENT DOCUMENTS

| | | | | |
|---|---|---|---|---|
| 4,741,799 A | | 5/1988 | Chen et al. ............... 156/643 |
| 5,994,737 A | * | 11/1999 | Sato ........................ 257/336 |
| 6,083,815 A | * | 7/2000 | Tsai et al. ................ 438/585 |
| 6,136,211 A | * | 10/2000 | Qian et al. ................. 216/37 |
| 6,187,685 B1 | * | 2/2001 | Hopkins et al. ........... 438/710 |
| 6,232,209 B1 | * | 5/2001 | Fujiwara et al. .......... 438/585 |
| 6,297,170 B1 | * | 10/2001 | Gabriel et al. ............ 438/738 |
| 6,335,275 B1 | * | 1/2002 | Yabata et al. ............. 438/639 |
| 6,383,938 B2 | * | 5/2002 | Pandhumsoporn et al. . 438/706 |
| 6,620,715 B1 | * | 9/2003 | Blosse et al. ............. 438/585 |

* cited by examiner

*Primary Examiner*—Nadine G. Norton
*Assistant Examiner*—Binh X. Tran
(74) *Attorney, Agent, or Firm*—Mayer, Fortkort and Williams; Joseph Bach

(57) ABSTRACT

Conventional methods of semiconductor fabrication and processing typically utilize three gas (e.g., HBr, $Cl_2$ and $O_2$) and four gas (e.g., HBr, $Cl_2$, $O_2$ and $CF_4$) chemistries to perform gate etching in plasma process chambers. However, the silicon to resist selectivity achieved by these chemistries is limited to about 3:1. The present invention concerns a plasma source gas comprising $SF_6$ and one or more fluorine-containing gases selected from $C_3F_6$, $C_4F_8$, $C_5F_8$, $CH_2F_2$, $CHF_3$, and $C_4F_6$ (e.g., $SF_6$ and $C_4F_8$), allowing the use of a two gas etch chemistry that provides enhanced silicon to photoresist selectivity in gate etching processes.

32 Claims, 2 Drawing Sheets

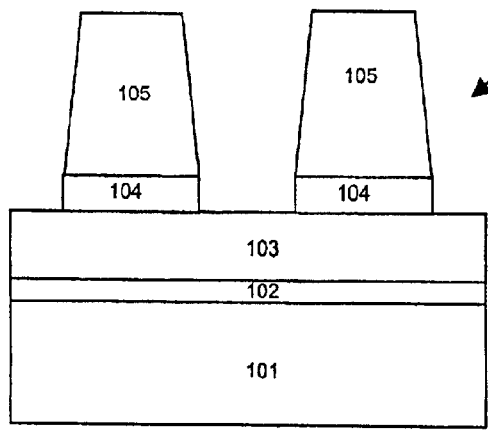
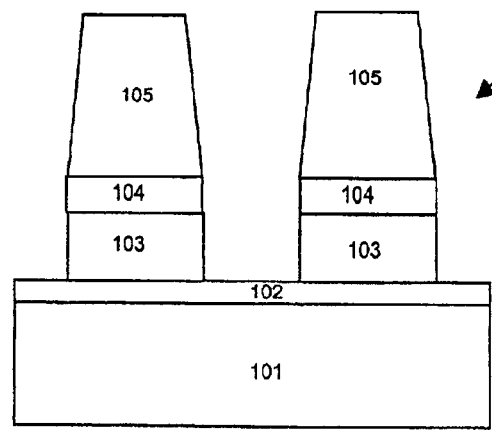
Fig. 2A　　　　　　　　　　Fig. 2B
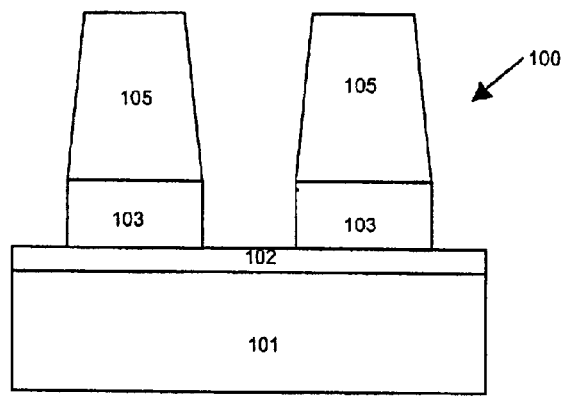
Fig. 2C

ETCHING METHOD HAVING HIGH SILICON-TO-PHOTORESIST SELECTIVITY

BACKGROUND OF THE INVENTION

1. Field of the Invention

The present invention relates to methods of etching silicon, and more particularly to methods of etching silicon while maintaining good photoresist selectivity.

2. Brief Description of the Background Art

Integrated circuit manufacturing processes often involve the creation of etch patterns in various materials by selective etching. For example, trenches are often made in a substrate such as silicon to provide isolation between individual devices or to provide capacitive charge storage or to define the gate for a transistor. Depending on the application, trench depths typically range from 1 to 4 microns in width and 0.5 to 5 in depth, although depths and widths beyond these ranges are clearly possible. In order to etch such silicon trenches, either a photoresist mask or an oxide hard-mask is typically used.

Commonly, these etch patterns are created by providing a patterned photoresist layer upon the material within which the etch pattern is to be made. Defining trenches with a photoresist mask simplifies the integration sequence and allows sidewall taper to be controlled. In general, the smaller the feature size that is required, the thinner the photoresist layer is required to be. Unfortunately, the thickness of a given photoresist layer frequently limits the thickness of the material that is to be etched, based on selectivity that exists between the photoresist and the material that is to be etched. Hence, by increasing selectivity, a thinner photoresist layer can be used.

In this connection, traditional silicon/polycrystalline silicon etching processes, and specifically polysilicon gate etching processes, are typically based on $HBr/Cl_2$ chemistry, which has its limitations. For example, the silicon:resist selectivity with this chemistry has an upper limit of about 2.5:1. Moreover, this chemistry produces significant chamber deposition, since etch by products such as $SiO_x$ and $Br_y$ are non-volatile. Related chemistries, including $HBr/Cl_2O_2$ and $CF_4/HBr/Cl_2/O_2$ chemistries, also have limitations, including silicon:resist selectivities of less than 3:1.

Other chemistries are known, such as $SF_6/HBr/O_2$ chemistry and $SF_6/CFH_3/O_2$ chemistry, which have good etch rates (about 1 micron/min), but have relatively low silicon-:resist selectivities (about 2–3:1) and produce re-entrant profiles with rough sidewalls. Other chemistries include a three-gas etch chemistry utilizing a $CF_4/Cl_2/N_2$ combination, producing less than a 1.5:1 selectivity.

With the trend toward smaller feature sizes, (e.g., the use of 193 nm resist instead of the current deep ultraviolet resist techniques), resist selectivities and resist thicknesses are expected to decrease even further from those associated with 248 nm photoresist.

SUMMARY OF THE INVENTION

The above and other demands of present day integrated circuit etching processes are addressed by the present invention. In particular, the present invention relates to a method for etching silicon utilizing a two-gas chemistry comprising $SF_6$ and one or more fluorine-containing gases selected from $C_3F_6$, $C_4F_8$, $C_5F_8$, $CH_2F_2$, $CHF_3$, and $C_4F_6$ (e.g., $SF_6$ and $C_4F_8$) that provides enhanced silicon-to-resist selectivity ratios. This method is particularly applicable to gate etching techniques, due to the enhanced polycrystalline silicon-to-resist selectivities that are achieved.

According to an exemplary embodiment of the invention, a gate etching process is provided, which comprises: (a) providing a structure comprising a silicon layer and a patterned photoresist layer over the silicon layer, wherein the patterned photoresist layer has apertures formed therein; and (b) etching the silicon layer through the apertures by a plasma etching process, wherein the plasma etching process is conducted in the presence of a plasma source gas that comprises $SF_6$ and one or more fluorine-containing gases selected from $C_3F_6$, $C_4F_8$, $C_5F_8$, $CH_2F_2$, $CHF_3$, and $C_4F_6$ (e.g., $SF_6$ and $C_4F_8$). The silicon layer can be, for example, a polycrystalline silicon layer, which may be doped or undoped. A ratio of $SF_6$ to fluorine-containing gas (e.g., $C_4F_8$) ranging from 0.67 to 1.5 is typical. Moreover, the pressure is relatively low, typically about 2 to 20 mT.

According to another exemplary embodiment of the invention, a method of etching a substrate structure, such as those commonly encountered in gate etch applications, is provided. The method comprises: (a) providing a substrate structure comprising: a silicon wafer (e.g., a single crystal silicon wafer), a dielectric layer (e.g., an oxide layer) over the single crystal silicon wafer, a doped polycrystalline silicon layer over the oxide layer, and a native oxide layer over the doped polycrystalline silicon layer, (b) providing a patterned mask structure over the substrate structure, the patterned mask structure having apertures formed therein; and (c) etching the substrate structure through the apertures by a plasma etching process, wherein the plasma etching process is conducted in the presence of a plasma source gas that comprises $SF_6$ and one or more fluorine-containing gases selected from $C_3F_6$, $C_4F_8$, $C_5F_8$, $CH_2F_2$, $CHF_3$, and $C_4F_6$ (e.g., $SF_6$ and $C_4F_8$). The etching step is typically conducted at a pressure ranging from 2 to 20 mT. Moreover, the flow ratio of $SF_6$ to fluorine-containing gas typically ranges from 0.67 to 1.5. The plasma etching process is typically a high-density plasma etching process. In some embodiments, an anti-reflective coating layer, for example, an inorganic anti-reflective coating layer, such as silicon oxynitride, or an organic anti-reflective coating layer, is provided beneath the photoresist layer.

One advantage of the present invention is that it provides an etching method that yields superior silicon to resist selectivity ratios which are particularly desirable when used in connection with 193 nm lithography.

The above and other embodiments and advantages of the present invention will become apparent to those of ordinary skill in the art upon reading the detailed description and claims to follow.

BRIEF DESCRIPTION OF THE DRAWINGS

FIGS. 2A, 2B and 2C are schematic partial cross-sectional views illustrating the structures of FIGS. 1A and 1B after etching processes in accordance with exemplary embodiments of the present invention.

DETAILED DESCRIPTION

As a preface to the detailed description, it should be noted that, all percentages (%) listed for gas constituents are % by volume, and all ratios listed for gas constituents are volume ratios.

The term "selectivity" is used to refer to (a) a ratio of etch rates of two materials and (b) a condition achieved during etch when etch rate of one material is increased in comparison with another material.

The present invention now will be described more fully hereinafter with reference to the accompanying drawings, in which exemplary embodiments of the present invention are shown. This invention may, however, be embodied in different forms and should not be construed as limited to the embodiments set forth herein.

Figure 1A:
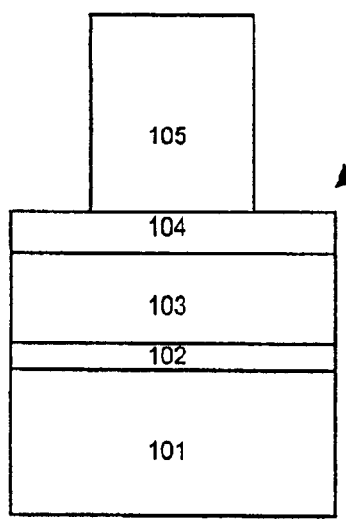
FIGS. 1A and 1B are schematic partial cross-sectional views depicting substrate structures in accordance with exemplary embodiments of the present invention.

The process of the present invention finds utility in silicon etching applications, particularly polycrystalline silicon gate conductor etching processes. Turning now to FIG. 1A, this schematic depicts a substrate structure in accordance with an exemplary embodiment of the present invention. As depicted therein, in this embodiment of the present invention, a substrate structure 100 is provided with a single crystal silicon wafer 101 having a dielectric gate insulator, typically an oxide layer 102, formed thereon. A doped polycrystalline silicon gate conductor layer 103 is formed on the oxide layer 102, and a dielectric layer 104 is formed on doped polycrystalline silicon layer 103. Finally a photoresist layer 105 is provided over dielectric layer 104.

The silicon wafer 101 can be of any appropriate thickness and can be fabricated using any method known in the art.

The gate oxide layer 102 can be any appropriate oxide layer, and is preferably a silicon dioxide layer. The gate oxide layer 102 is typically 10 to 50 Angstroms in thickness and can be provided using any appropriate method known in the art.

The polycrystalline silicon layer 103, which is the layer that is ultimately etched in this embodiment of the invention, is produced by methods well known in the art. This layer has a thickness that ranges, for example, from 500 to 6000 Angstroms, typically 1000 to 3000 Angstroms, and can be undoped, n-doped or p-doped.

Materials for dielectric layer 104 include silicon dioxide, silicon nitride and silicon oxynitride, with silicon oxynitride (particularly silicon-rich silicon oxynitride) being typical. Silicon oxynitride has been used in the semiconductor industry for some time as an antireflective layer (also referred to as an anti-reflective coating or "ARC") in which reflected light levels are reduced by phase shift cancellation. Effective phase shift cancellation can be achieved, for example, by providing a layer of silicon oxynitride that is 200–600 Angstroms in thickness for 248 nm lithography or by providing a layer that is 250–500 Angstroms in thickness for 193 nm lithography. Methods of forming silicon oxynitride layers are well known in the art.

In some embodiments of the invention, the dielectric layer 104 is replaced by a non-dielectric layer, for example, an organic layer which serves as an anti-reflective coating by absorbing incident light and is typically 500 to 1000 Angstroms thick. In this regard layer 104 shall refer to such an anti-reflective coating as well.

The material selected for the photoresist layer 105 can be essentially any known photoresist material. Presently, organic photoresist materials available in the art for deep ultraviolet (e.g., 193 nm and 248 nm) photolithography are used. Due to the enhanced selectivities observed with the present invention, a thin photoresist layer can be utilized, which allows, for example, for the creation of patterned photoresist layers with very small feature sizes.

Although not illustrated in FIG. 1A, where silicon oxynitride is selected as an anti-reflective coating 104 material, an additional barrier layer is frequently provided 9.5¢ between the anti-reflective coating layer 104 and the photoresist layer 105 to avoid nitrogen migration (commonly referred to as "poisoning") within the resist layer 105.

Figure 1B:
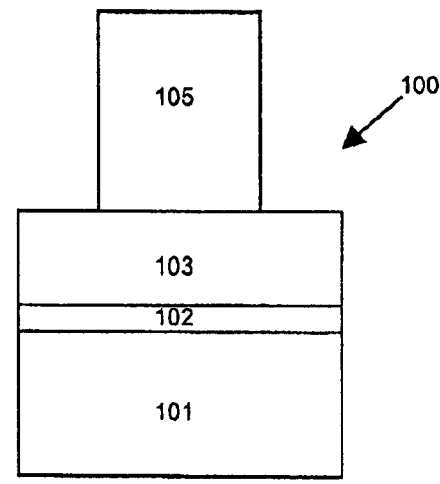

In some embodiments of the invention, the dielectric/anti-reflective coating layer 104 is not used at all, resulting in a substrate structure as shown in FIG. 1B. Specifically, FIG. 1B illustrates a substrate structure 100 similar to that shown in FIG. 1A, but excludes the dielectric/anti-reflective coating layer 104 shown in FIG. 1A. Accordingly this substrate structure comprises a single crystal silicon wafer 101 with an oxide layer 102 formed thereon. A doped polycrystalline silicon layer 103 is formed on the oxide layer 102. Finally, a photoresist layer 105 is provided on polycrystalline silicon layer 103.

After the desired overall structure is provided, the structure can be etched in a series of steps. Etching may be conducted in any suitable plasma processing apparatus. Typically, the plasma processing apparatus used provides a high-density plasma, which may be defined as a plasma having a density that typically ranges from about $1 \times 10^{11}$ to about $5 \times 10^{12}$ cm$^{-3}$. The source of the high-density plasma may be any suitable high-density source, such as electron cyclotron resonance (ECR), helicon resonance, or inductively coupled plasma (ICP) sources. Each of these is currently in use on semiconductor production equipment. The main difference is that ECR and helicon sources employ an external magnetic field to shape and contain the plasma, while inductively coupled plasma sources do not In a specific exemplary process, the structure of FIG. 1A is etched within a DPS (decoupled plasma source) series chamber available from Applied Materials, Inc. of Santa Clara, Calif. or other inductive plasma etching chamber.

An example of such a series of steps, which uses a substrate structure like that of FIG. 1A, is presented in FIGS. 2A–2B.

As a first etching step, the anti-reflective coating layer 104 (and any additional barrier layer such as silicon dioxide) is opened to produce the structure illustrated in FIG. 2A. For example, where silicon oxynitride is used as the anti-reflective coating layer 104, essentially any etching chemistry known in the art for etching silicon oxynitride can be used. Typical etching chemistries are those that utilize a plasma source gas which includes a halogen containing species, commonly a chlorine containing species such as $Cl_2$. (These chemistries are also effective for etching the barrier layer that may be present.)

It is noted that although such processes may etch the photoresist layer 105 at a faster rate than the silicon oxynitride layer 104, a thin (e.g., 1000–2500 Angstroms) photoresist layer can nonetheless be used, due to the small thickness (e.g., 250–300 Angstroms) of the silicon oxynitride layer.

After opening the anti-reflective coating layer 104, an etching process is conducted to open the polycrystalline silicon layer 103 using the process of the present invention.

The process of the present invention is preferably a relatively low-pressure process, with pressures typically in the range of 2–20 mT.

J Plasma source gases for use in connection with this particular example of the present invention are $SF_6$ and $C_4F_8$. The use of $SF_6$ $C_4F_8$ chemistry increases the silicon (in this instance, polycrystalline silicon) to photoresist selectivity to a range of 2.5:1 to 8.0:1. In this application, $SF_6$ is the primary etchant. The $C_4F_8$ component gas, however, provides sidewall passivation by dissociating in the plasma to form $CF_x$ monomers (where x is an integer) that then polymerize to form Teflon-like polymers. This polymer deposition results in higher resist selectivity. In this regard any feed gas that can dissociate in the plasma to produce CF, monomers can be used to achieve similar higher selectivity results. These gases include $C_3F_6$, $C_5F_8$, $CH_2F_2$, $CHF_3$, and $C_4F_6$. To obtain an optimum profile, the ratio of $SF_6$ flow to $C_4F_8$ flow is preferably between 0.67 and 1.5.

To obtain the best selectivity, bias power is less than 150 W and typically about 60 W (e.g., within the range of 40–150 W). Source power has been found to be optimum at about 600 W (e.g., within the range of preferably 400–1200 W). The aforementioned conditions result in a polycrystalline silicon etch rate ranging from 2000–2600 Angstroms/min. Polycrystalline silicon:photoresist selectivity is approximately 8:1.

The results of this etching step is depicted in FIG. 2B. FIG. 2B depicts the profile of a substrate structure after etching the polycrystalline silicon layer 103 with the $SF_6$/$C_4F_8$ chemistry in accordance with the exemplary method of the present invention.

Finally, following the etching step described above any remaining photoresist and the anti-reflective coating layer are removed.

The dielectric/anti-reflective coating layer 104 depicted in FIG. 1A is absent from the structure in FIG. 113. Accordingly, as a first etching step, the polycrystalline layer 103 is opened using the process of the present invention described above with respect to layer 103. The resulting structure is depicted in FIG. 2C, which depicts the profile of a substrate structure after etching the polycrystalline layer 103 with the $SF_6$/$C_4F_8$ chemistry described above in conjunction with FIG. 2B. Similar to the above, following the etching of polycrystalline layer 103 to provide the structure of FIG. 2C, any remaining photoresist 105 is removed.

Although various embodiments are specifically illustrated and described herein, it will be appreciated that modifications and variations of the present invention are covered by the above teachings and are within the purview of the appended claims without departing from the spirit and intended scope of the invention.

All the features disclosed in this specification (including any accompanying claims, abstract and drawings), and/or all of the steps of any method or process so disclosed, may be combined in any combination, except for combinations where at least some of the features and/or steps are mutually exclusive.

Each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. A method of etching a substrate structure comprising:
   providing a substrate structure comprising: a silicon wafer, a dielectric layer over said silicon wafer, a doped polycrystalline silicon layer over said dielectric layer, and a patterned mask structure over said substrate structure, said patterned mask structure having apertures formed therein; and
   etching said dosed polycrystalline silicon layer through said apertures by a plasma etching process, wherein said plasma etching process is conducted at a pressure ranging from about 2 to 20 mT in the presence of a plasma source gas that comprises $SF_6$ M and one or more fluorine-containing gases selected from the group consisting of $C_3F_6$, $C_4F_8$, $C_5F_8$, $CH_2F_2$, $C_4F_6$, wherein a ratio of said $SF_6$ to said one or more fluorine-containing gases ranges from 0.67 to 1.5.

2. The method according to claim 1 wherein said plasma source gas consists essentially of $SF_6$ and $C_3F_6$.

3. The method according to claim 1 wherein said plasma source gas consists essentially of $SF_6$ and $C_5F_8$.

4. The method according to claim 1 wherein said plasma source gas consists essentially of $SF_6$ and $CH_2F_2$.

5. The method according to claim 1 wherein said plasma source gas consists essentially of $SF_6$ and $CHF_3$.

6. The method according to claim 1 wherein said plasma source gas consists essentially of $SF_6$ and $C_4F_6$.

7. The method according to claim 1 wherein the polycrystalline silicon:mask structure slcectivity ranges from 2.5 to 8.

8. The method according to claim 1 wherein an etch rate of the polycrystalline silicon layer ranges from 200 to 2600 Angstroms per minute.

9. The method of claim 1, wherein said dielectric layer is an oxide layer.

10. The method of claim 1, wherein said substrate structure further comprises a native oxide layer over said doped polycrystalline silicon layer and beneath said patterned mask structure.

11. The method according to claim 1, wherein said plasma etching process is a high-density plasma etching process.

12. The method according to claim 1, wherein said patterned mask structure is a patterned photoresist layer.

13. The method according to claim 12 wherein said substrate structure further comprises a patterned anti-reflective coating layer beneath said photoresist layer.

14. The method according to claim 13, wherein said anti-reflective coating layer is a silicon oxynitride layer.

15. The method according to claim 13, wherein said anti-reflective coating layer is an organic anti-reflective coating layer.

16. A method of etching a substrate structure comprising:
   providing a substrate structure comprising a silicon wafer a dielectric layer over said silicon wafer, a doped polycrystalline silicon layer over said dielectric layer, and a patterned mask structure over said substrate structure, said patterned mask structure having apertures formed therein; and
   etching said doped polycrystalline silicon layer through said apertures by a plasma etching process, wherein said plasma etching process is conducted at a pressure ranging from about 2 to 20 mT in the presence of a plasma source gas that consists essentially of $SF_6$ and $C_4F_8$.

17. A method of etching a substrate structure, said method comprising:
   providing a substrate structure comprising: a single crystal silicon wafer, an oxide layer over said single crystal silicon layer, a doped polycrystalline silicon layer over said oxide layer, a silicon oxynitride layer over said doped polycrystalline silicon layer, and a patterned photoresist layer over said substrate structure, said patterned mask structure having apertures formed therein; and
   etching said doped polycrystalline silicon layer through said apertures by a plasma etching process, wherein said plasma etching process is conducted in the presence of a plasma source gas that consists essentially of $SF_6$ and one or more fluorine containing gases selected from the group consisting of $C_3F_6$ $C_4F_8$ $C_5F_8$, $CH_2F_2$, $CHF_3$, and $C_4F_6$, said etching step being conducted at a pressure ranging from 2 to 20 mT, wherein a ratio of said $SF_6$ to said one or more fluorine-containing gases ranges from 0.67 to 1.5.

18. A gate etch process comprising:

providing a structure comprising a silicon layer and a patterned photoresist layer over said silicon layer said patterned photoresist layer having apertures formed therein; and etching said silicon layer through said apertures by a gate etch process, wherein said gate etch process is conducted at a pressure ranging from about 2 to 20 mT in the presence of a plasma source as that comprises $SF_6$ and one or more fluorine-containing gases selected from the group consisting of $C_3C_6$, $C_4F_8$, $CH_2F_2$, $CHF_3$, and $C_4F_6$, wherein a ratio of said $SF_6$ to said fluorine-containing gases ranges from 0.67 to 1.5.

19. The method according to claim 18, wherein said silicon layer is a doped polycrystalline silicon layer.

20. The gate etching process according to claim 18, wherein said gate etch process is a high-density plasma etching process.

21. The method according to claim 18 wherein said plasma source gas consists essentially of $SF_6$ and $C_3F_6$.

22. The method according to claim 18 wherein said plasma source gas consists essentially of $SF_6$ and $C_5F_8$.

23. The method according to claim 18 wherein said plasma source gas consists essentially of $SF_6$ and $CH_2F_2$.

24. The method according to claim 18 wherein said plasma source gas consists essentially of $SF_6$ and $CHF_3$.

25. The method according to claim 18 wherein said plasma source gas consists essentially of $SF_6$ and $C_4F_6$.

26. The method according to claim 18 wherein the silicon:photoresist selectivity ranges from 2.5 to 8.

27. A The method according to claim 18 wherein an etch rate of the silicon layer ranges from 200 to 2600 Angstroms per minute.

28. The method according to claim 18 wherein said substrate structure further comprises a patterned anti-reflective coating layer beneath said photoresist layer.

29. The method according to claim 20, wherein said anti-reflective coating layer is a silicon oxynitride layer.

30. The method according to claim 20, wherein said anti-reflective coating layer is an organic anti-reflective coating layer.

31. The method according to claim 20, wherein said silicon layer is a doped polycrystalline silicon layer.

32. A gate etch process comprising:

providing a structure comprising a silicon layer and a patterned photoresist layer over said silicon layer said patterned photoresist layer having apertures formed therein; and etching said silicon layer through said apertures by a gate etch process, wherein said gate etch process is conducted at a pressure ranging from about 2 to 20 mT in the presence of a plasma source gas that consists essentially of $SP_6$ and $C_4F_8$.

* * * * *